US009834704B2

(12) United States Patent
Kraft et al.

(10) Patent No.: US 9,834,704 B2
(45) Date of Patent: Dec. 5, 2017

(54) COBALT DISHING CONTROL AGENTS

(71) Applicant: Cabot Microelectronics Corporation, Aurora, IL (US)

(72) Inventors: Steven Kraft, Naperville, IL (US); Andrew Wolff, Darien, IL (US); Phillip W. Carter, Round Lake, IL (US); Benjamin Petro, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 14/919,490

(22) Filed: Oct. 21, 2015

(65) Prior Publication Data
US 2016/0108285 A1    Apr. 21, 2016

Related U.S. Application Data

(60) Provisional application No. 62/066,484, filed on Oct. 21, 2014, provisional application No. 62/198,002, filed on Jul. 28, 2015.

(51) Int. Cl.
C09G 1/02 (2006.01)
B24B 37/04 (2012.01)
H01L 21/321 (2006.01)

(52) U.S. Cl.
CPC .............. C09G 1/02 (2013.01); B24B 37/044 (2013.01); H01L 21/3212 (2013.01)

(58) Field of Classification Search
None
See application file for complete search history.

(56) References Cited

U.S. PATENT DOCUMENTS

| | | | |
|---|---|---|---|
| 4,711,735 A | 12/1987 | Gulley | |
| 5,196,353 A | 3/1993 | Sandhu et al. | |
| 5,230,833 A | 7/1993 | Romberger et al. | |
| 5,316,573 A | 5/1994 | Brusic et al. | |
| 5,433,651 A | 7/1995 | Lustig et al. | |
| 5,567,534 A | 10/1996 | Yano et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,527,817 B1 * | 3/2003 | Fang .................. | C09G 1/02 257/E21.304 |
| 6,585,933 B1 | 7/2003 | Ehrhardt et al. | |
| 6,984,340 B1 * | 1/2006 | Brady .................. | C09D 5/086 252/175 |
| 7,931,714 B2 | 4/2011 | Chang | |
| 8,337,716 B2 | 12/2012 | Chang | |
| 8,338,300 B2 | 12/2012 | Lee et al. | |
| 8,641,920 B2 | 2/2014 | Chang et al. | |
| 8,717,710 B2 | 5/2014 | Dai et al. | |
| 8,722,592 B2 | 5/2014 | Matulewicz et al. | |
| 9,039,925 B2 | 5/2015 | Chen et al. | |
| 9,045,717 B2 | 6/2015 | Nakanishi et al. | |
| 2004/0148867 A1 | 8/2004 | Matsumi | |
| 2008/0233836 A1 * | 9/2008 | Horikawa ............... | C09G 1/02 451/36 |
| 2009/0184287 A1 * | 7/2009 | Chang ..................... | C09G 1/02 252/79.1 |
| 2010/0029079 A1 | 2/2010 | Ghosh et al. | |
| 2010/0151683 A1 | 6/2010 | Liu | |
| 2010/0163784 A1 | 7/2010 | Chang et al. | |
| 2010/0193728 A1 * | 8/2010 | Chang ..................... | C09G 1/02 252/79.1 |
| 2011/0100956 A1 * | 5/2011 | Keleher .................. | C09G 1/02 216/37 |
| 2013/0045598 A1 | 2/2013 | Guo et al. | |
| 2013/0140273 A1 | 6/2013 | Lu et al. | |
| 2013/0186850 A1 | 7/2013 | Wang et al. | |
| 2013/0261040 A1 | 10/2013 | Kawada et al. | |

(Continued)

FOREIGN PATENT DOCUMENTS

| | | |
|---|---|---|
| CN | 101525563 A | 9/2009 |
| CN | 101580700 A | 11/2009 |

(Continued)

OTHER PUBLICATIONS

Korean Intellectual Property Office, International Search Report in International Patent Application No. PCT/US2015/056749 (dated Jan. 28, 2016).
Korean Intellectual Property Office, International Search Report in International Patent Application No. PCT/US2015/056756 (dated Jan. 28, 2016).
Jiang et al., "Synergetic effect of $H_2O_2$ and glycine on cobalt CMP in weakly alkaline slurry," *Microelectronic Engineering*, 122: 82-86 (2014).
Peethala et al., "Cobalt Polishing with Reduced Galvanic Corrosion at Copper/Cobalt Interface Using Hydrogen Peroxide as an Oxidizer in Colloidal Silica-Based Slurries," *Journal of the Electrochemical Society*, 159(6): H582-H588 (2012).

(Continued)

Primary Examiner — Shamim Ahmed
(74) Attorney, Agent, or Firm — Thomas Omholt; Erika S. Wilson; Francis J. Koszyk

(57) ABSTRACT

The invention provides a chemical-mechanical polishing composition comprising (a) abrasive particles, (b) a cobalt corrosion inhibitor, (c) a cobalt dishing control agent, wherein the cobalt dishing control agent comprises an anionic head group and a $C_{13}$-$C_{20}$ aliphatic tail group, (d) an oxidizing agent that oxidizes cobalt, and (e) water, wherein the polishing composition has a pH of about 3 to about 8.5. The invention further provides a method of chemically-mechanically polishing a substrate with the inventive chemical-mechanical polishing composition. Typically, the substrate contains cobalt.

7 Claims, No Drawings

(56) References Cited

U.S. PATENT DOCUMENTS

| | | |
|---|---|---|
| 2014/0004703 A1 | 1/2014 | Noller et al. |
| 2014/0011361 A1* | 1/2014 | Reichardt ............... C09G 1/02 438/693 |
| 2014/0199840 A1 | 7/2014 | Bajaj et al. |
| 2014/0242798 A1* | 8/2014 | Izawa ................. C09K 3/1445 438/693 |
| 2014/0243250 A1 | 8/2014 | Miller et al. |
| 2015/0102012 A1* | 4/2015 | Reiss ...................... C09G 1/02 216/89 |
| 2015/0152289 A1 | 6/2015 | Zhang et al. |
| 2015/0290760 A1* | 10/2015 | Serikawa ................. B24B 1/00 451/41 |
| 2016/0027657 A1* | 1/2016 | Shi ......................... C09G 1/02 438/693 |
| 2016/0068710 A1* | 3/2016 | Wang ................ H01L 21/3212 438/693 |

FOREIGN PATENT DOCUMENTS

| | | |
|---|---|---|
| JP | 2011-159658 A | 8/2011 |
| KR | 10-2009-0087268 A | 8/2009 |
| KR | 10-2013-0129997 A | 11/2013 |
| TW | 200925326 A | 6/2009 |
| WO | WO 2012/127399 A1 | 9/2012 |

OTHER PUBLICATIONS

Žerjav et al., "Carboxylic Acids as Corrosion Inhibitors for Cu, Zn and Brasses in Simulated Urban Rain," *International Journal of Electrochemical Science*, 9: 2696-2715 (2014).

Korean Intellectual Property Office, International Search Report in International Patent Application No. PCT/US2015/056744 (dated Dec. 23, 2015).

Taiwan Intellectual Property Office, Search Report issued in connection with Taiwan Patent Application No. 104134569 dated Aug. 10, 2017.

\* cited by examiner

COBALT DISHING CONTROL AGENTS

CROSS REFERENCE TO RELATED APPLICATIONS

This patent application claims the benefit of U.S. Provisional Patent Application Nos. 62/066,484, filed Oct. 21, 2014, and 62/198,002, filed Jul. 28, 2015, which are incorporated by reference.

BACKGROUND OF THE INVENTION

In the fabrication of integrated circuits and other electronic devices, multiple layers of conducting, semiconducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process whereby material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry), for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

Cobalt is emerging as a metal for integration into advanced integrated circuit devices. Effective integration of cobalt will require CMP methods with high removal rates, good planarization efficiency, low dishing and erosion, and low defectivity. At pH 9.5 and above, cobalt forms an insoluble, passivating oxide-hydroxide coating. Below that pH, cobalt readily reacts with water to form soluble, hydrated Co(II) species. U.S. Patent Application Publication 2014/0243250 A1 discloses polishing compositions exhibiting moderate cobalt removal rates at pH 9.0 and above, but requires high particle loading and high downforce pressure, which are disadvantageous from economic and processing viewpoints.

Aggressive formulations are normally required to achieve acceptable cobalt rates. Integrated circuit devices typically comprise patterned wafers having circuit lines etched into substrates which typically comprise dielectric materials such as silicon oxide. Layering cobalt over the surface of the patterned substrates allows for formation of cobalt circuit lines. The cobalt is then removed by polishing to the level of the underlying dielectric. Erosion refers to the loss of dielectric materials within the patterned region, and may be mitigated by control of abrasive content. Dishing refers to the loss of cobalt within circuit traces. Dishing control is more challenging and requires polishing compositions with the ability to stop or reduce cobalt removal within the traces once the overlying blanket of cobalt is removed to expose underlying dielectric materials.

Thus, a need remains in the art for polishing compositions that provide high cobalt removal rates while exhibiting acceptable dishing, erosion, corrosion, and low defectivity.

BRIEF SUMMARY OF THE INVENTION

The invention provides a chemical-mechanical polishing composition comprising (a) abrasive particles, (b) a cobalt corrosion inhibitor, (c) a cobalt dishing control agent, wherein the cobalt dishing control agent comprises an anionic head group and a $C_{13}$-$C_{20}$ aliphatic tail group, (d) an oxidizing agent that oxidizes cobalt, and (e) water, wherein the polishing composition has a pH of about 3 to about 8.5.

The invention also provides a method of chemically mechanically polishing a substrate comprising (i) contacting a substrate with a polishing pad and a chemical-mechanical polishing composition comprising (a) abrasive particles, (b) a cobalt corrosion inhibitor, (c) a cobalt dishing control agent, wherein the cobalt dishing control agent comprises an anionic head group and a $C_{13}$-$C_{20}$ aliphatic tail group, (d) an oxidizing agent that oxidizes cobalt, and (e) water, wherein the polishing composition has a pH of about 3 to about 8.5, (ii) moving the polishing pad and the chemical mechanical polishing composition relative to the substrate, and (iii) abrading at least a portion of the substrate to polish the substrate.

DETAILED DESCRIPTION OF THE INVENTION

The invention provides a chemical-mechanical polishing composition comprising (a) abrasive particles, (b) a cobalt corrosion inhibitor, (c) a cobalt dishing control agent, wherein the cobalt dishing control agent comprises an anionic head group and a $C_{13}$-$C_{20}$ aliphatic tail group, (d) an oxidizing agent that oxidizes cobalt, and (e) water, wherein the polishing composition has a pH of about 3 to about 8.5.

The polishing composition comprises an abrasive (i.e., one or more abrasives). The abrasive can be any suitable abrasive or combination of abrasives in the form of particles. The abrasive can be any suitable abrasive, for example, the abrasive can be natural or synthetic, and can comprise metal oxide, carbide, nitride, carborundum, diamond, and the like. The abrasive also can be a polymer particle or a coated particle. The abrasive desirably comprises, consists essentially of, or consists of a metal oxide. Typically, the metal oxide is selected from the group consisting of silica, alumina, (e.g., alpha alumina particles (i.e., α-alumina), gamma alumina particles (i.e., γ-alumina), delta alumina particles (i.e., δ-alumina), or fumed alumina particles), ceria, zirconia, co-formed products thereof, and combinations thereof. The abrasive particles are desirably anionic in preferred embodiments.

Preferably, the chemical-mechanical polishing composition comprises a silica abrasive. The silica can be any suitable silica, for example, the silica can be a wet-process silica or a fumed silica. Preferably, the silica is a wet-process silica.

The wet-process silica can be any suitable wet-process silica. For example, the wet-process silica can be condensation-polymerized silica. Condensation-polymerized silica particles typically are prepared by condensing $Si(OH)_4$ to form colloidal particles, where colloidal is defined as having an average particle size between about 1 nm and about 1000 nm. Such abrasive particles can be prepared in accordance with U.S. Pat. No. 5,230,833 or can be obtained as any of various commercially available products, such as the Akzo-Nobel Bindzil 50/80 product and the Nalco 1050, 1060, 2327, and 2329 products, as well as other similar products available from DuPont, Bayer, Applied Research, Nissan Chemical, Fuso, and Clariant.

The abrasive particles can have any suitable surface charge. Preferably, the abrasive particles are anionic abrasive particles. By "anionic" is meant that the abrasive particles have a negative surface charge at the pH of the polishing composition. The abrasive particles can be anionic in their natural state at the pH of the polishing composition, or the abrasive particles can be rendered anionic at the pH of the polishing composition using any method known to those of ordinary skill in the art, such as, for example, by surface metal doping, e.g., by doping with aluminum ions, or by surface treatment with a tethered organic acid, a tethered sulfur-based acid, or a tethered phosphorus-based acid.

The abrasive can have any suitable average particle size (i.e., average particle diameter). The abrasive can have an average particle size of about 5 nm or more, e.g., about 10 nm or more, about 15 nm or more, about 20 nm or more, about 25 nm or more, about 30 nm or more, about 35 nm or more, or about 40 nm or more. Alternatively, or in addition, the abrasive can have an average particle size of about 150 nm or less, e.g., about 140 nm or less, about 130 nm or less, about 120 nm or less, about 110 nm or less, or about 100 nm or less. Thus, the abrasive can have a maximum in a particle size distribution bounded by any two of the above endpoints. For example, the abrasive can have an average particle size of about 5 nm to about 150 nm, about 10 nm to about 140 nm, about 15 nm to about 130 nm, about 20 nm to about 120 nm, about 20 nm to about 110 nm, about 20 nm to about 100 nm, about 30 nm to about 150 nm, about 30 nm to about 140 nm, about 30 nm to about 130 nm, about 30 nm to about 120 nm, about 30 nm to about 110 nm, about 30 nm to about 100 nm, about 35 nm to about 150 nm, about 35 nm to about 140 nm, about 35 nm to about 130 nm, about 35 nm to about 120 nm, about 35 nm to about 110 nm, or about 35 nm to about 100 nm. For spherical abrasive particles, the size of the particle is the diameter of the particle. For non-spherical abrasive particles, the size of the particle is the diameter of the smallest sphere that encompasses the particle. The particle size of the abrasive can be measured using any suitable technique, for example, using laser diffraction techniques. Suitable particle size measurement instruments are available from, for example, Malvern Instruments (Malvern, UK).

The abrasive particles preferably are colloidally stable in the inventive polishing composition. The term colloid refers to the suspension of particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition can comprise any suitable amount of abrasive particles. If the polishing composition of the invention comprises too little abrasive, the composition may not exhibit a sufficient removal rate. In contrast, if the polishing composition comprises too much abrasive, then the polishing composition may exhibit undesirable polishing performance and/or may not be cost effective and/or may lack stability. The polishing composition can comprise about 10 wt. % or less of abrasive, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1.5 wt. % or less, about 1 wt. % or less, about 0.9 wt. % or less, about 0.8 wt. % or less, about 0.7 wt. % or less, about 0.6 wt. % or less, or about 0.5 wt. % or less of abrasive. Alternatively, or in addition, the polishing composition can comprise about 0.05 wt. % or more of abrasive, for example, about 0.1 wt. % or more, about 0.2 wt. % or more, about 0.3 wt. % or more, about 0.4 wt. % or more, about 0.5 wt. % or more, or about 1 wt. % or more. Thus, the polishing composition can comprise abrasive particles in an amount bounded by any two of the aforementioned endpoints. For example, the polishing composition can comprise about 0.05 wt. % to about 10 wt. % of abrasive, for example, 0.1 wt. % to about 10 wt. %, about 0.1 wt. % to about 9 wt. %, about 0.1 wt. % to about 8 wt. %, about 0.1 wt. % to about 7 wt. %, about 0.1 wt. % to about 6 wt. %, about 0.1 wt. % to about 5 wt. %, about 0.1 wt. % to about 4 wt. %, about 0.1 wt. % to about 3 wt. %, about 0.1 wt. % to about 2 wt. %, about 0.2 wt. % to about 2 wt. %, about 0.3 wt. % to about 2 wt. %, about 0.4 wt. % to about 2 wt. %, about 0.5 wt. % to about 2 wt. %, about 0.1 wt. % to about 1.5 wt. %, about 0.2 wt. % to about 1.5 wt. %, about 0.3 wt. % to about 1.5 wt. %, about 0.4 wt. % to about 1.5 wt. %, about 0.5 wt. % to about 1.5 wt. %, about 0.1 wt. % to about 1 wt. %, about 0.2 wt. % to about 1 wt. %, about 0.3 wt % to about 1 wt. %, about 0.4 wt. % to about 1 wt. %, or about 0.5 wt % to about 1 wt. % of abrasive.

The polishing composition comprises a cobalt corrosion inhibitor. The cobalt corrosion inhibitor can be any suitable cobalt corrosion inhibitor. In an embodiment, the cobalt corrosion inhibitor comprises an anionic head group and a $C_8$-$C_{14}$ aliphatic tail group, for example, a $C_8$-$C_{14}$ alkyl or a $C_8$-$C_{14}$ alkenyl tail group. The anionic head group can be any suitable anionic head group. In a preferred embodiment, the cobalt corrosion inhibitor comprises a sarcosine derivative having the structure: R—$CON(CH_3)CH_2COOH$ wherein $CON(CH_3)CH_2COOH$ forms the head group and R forms the tail group. The R group is typically a $C_9$-$C_{13}$ aliphatic group and can be a $C_8$-$C_{13}$ alkyl group or a $C_8$-$C_{13}$ alkenyl group, for example, a $C_8$ alkyl group, a $C_9$ alkyl group, $C_{10}$ alkyl group, $C_{11}$ alkyl group, $C_{12}$ alkyl group, $C_{13}$ alkyl group, $C_8$ alkenyl group, $C_9$ alkenyl group, $C_{10}$ alkenyl group, $C_{11}$ alkenyl group, $C_{12}$ alkenyl group, or $C_{13}$ alkenyl group. In a preferred embodiment wherein the cobalt corrosion inhibitor is a sarcosine derivative, conventional naming of the tail group includes the carbonyl to which the R group is attached for carbon counting purposes. Thus, a $C_{12}$ sarcosinate refers to a lauroyl sarcosinate. When the tail group is an alkenyl group, wherein the double bond is not at the terminus of the tail group, the alkenyl group can have the E configuration or the Z configuration, or can be a mixture of E and Z isomers. The cobalt corrosion inhibitor can be a single compound, or can be a mixture of two or more compounds having an anionic head group and a $C_8$-$C_{20}$ aliphatic tail group or a mixture of two or more sarcosine derivatives as described herein having a $C_7$-$C_{19}$ aliphatic R group, provided that about 75 wt. % or more (e.g., about 80 wt. % or more, about 85 wt. % or more, about 90 wt. % or more, or about 95 wt. % or more) of the compounds comprise an anionic head group and a $C_{10}$-$C_{14}$ aliphatic tail group or are sarcosine derivatives having $C_9$-$C_{13}$ aliphatic R groups.

The polishing composition can comprise any suitable amount of the cobalt corrosion inhibitor. The polishing composition can comprise about 1 ppm or more of the cobalt corrosion inhibitor, for example, about 5 ppm or more, about 10 ppm or more, about 20 ppm or more, about 30 ppm or more, about 40 ppm or more, or about 50 ppm or more. Alternatively, or in addition, the polishing composition can comprise about 1000 ppm or less of the cobalt corrosion inhibitor, for example, about 900 ppm or less, about 800 ppm or less, about 700 ppm or less, about 600 ppm or less, about 500 ppm or less, about 400 ppm or less, about 300 ppm or less, or about 200 ppm or less. Thus, the polishing composition can comprise the cobalt corrosion inhibitor in an amount bounded by any two of the aforementioned endpoints. For example, the polishing composition can comprise about 1 ppm to about 1000 ppm of the cobalt corrosion inhibitor, about 10 ppm to about 900 ppm, about 10 ppm to about 800 ppm, about 10 ppm to about 700 ppm, about 10 ppm to about 600 ppm, about 10 ppm to about 500 ppm, about 10 ppm to about 400 ppm, about 20 ppm to about 300 ppm, about 30 ppm to about 200 ppm, about 30 ppm to about 150 ppm, about 30 ppm to about 100 ppm, or about 50 ppm to about 100 ppm.

The polishing composition comprises a cobalt dishing control agent. The cobalt dishing control agent can be any suitable cobalt dishing control agent. In an embodiment, the cobalt dishing control agent comprises an anionic head group and a $C_{13}$-$C_{20}$ aliphatic group, for example, a $C_{13}$-$C_{20}$ alkyl group or a $C_{13}$-$C_{20}$ alkenyl tail group. Preferably, the cobalt dishing control agent comprises an anionic head group and a $C_{15}$-$C_{18}$ aliphatic tail group. The anionic head group can be any suitable anionic head group. In a preferred embodiment, the anionic head group comprises a sarcosine derivative having the structure: R—CON(CH$_3$)CH$_2$COOH wherein CON(CH$_3$)CH$_2$COOH forms the head group and R forms the tail group. The R group is typically a $C_{13}$-$C_{20}$ aliphatic group and can be a $C_{13}$ alkyl group, $C_{14}$ alkyl group, $C_{15}$ alkyl group, $C_{16}$ alkyl group, $C_{17}$ alkyl group, $C_{18}$ alkyl group, $C_{19}$ alkyl group, $C_{20}$ alkyl group, $C_{13}$ alkenyl group, $C_{14}$ alkenyl group, $C_{15}$ alkenyl group, $C_{16}$ alkenyl group, $C_{17}$ alkenyl group, $C_{18}$ alkenyl group, $C_{19}$ alkenyl group, or $C_{20}$ alkenyl group. Preferably, the R group is a $C_{15}$-$C_{17}$ aliphatic group. In a preferred embodiment wherein the cobalt dishing control agent is a sarcosine derivative, conventional naming of the tail group includes the carbonyl to which the R group is attached for carbon counting purposes. Thus, a $C_{18}$ sarcosinate refers to, for example a stearoyl sarcosinate or an oleoyl sarcosinate. When the tail group is an alkenyl group, wherein the double bond is not at the terminus of the tail group, the alkenyl group can have the E configuration, the Z configuration, or can be a mixture of E and Z isomers. The cobalt dishing control agent can be a single compound, or can be a mixture of two or more compounds having an anionic head group and a $C_{13}$-$C_{20}$ alkyl or a $C_{13}$-$C_{20}$ alkenyl tail group.

In another embodiment, the anionic head group comprises a diphenyloxide disulfonate group. An example of a suitable diphenyloxide disulfonate-containing cobalt dishing control agent is a compound of the formula:

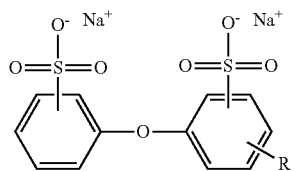

wherein R is a $C_{13}$-$C_{20}$ aliphatic tail group, preferably a $C_{16}$-$C_{18}$ aliphatic tail group.

The polishing composition can comprise any suitable amount of the cobalt dishing control agent. The polishing composition can comprise about 1 ppm or more of the cobalt dishing control agent, for example, about 5 ppm or more, about 10 ppm or more, about 14 ppm or more, about 20 ppm or more, or about 25 ppm or more. Alternatively, or in addition, the polishing composition can comprise about 100 ppm or less of the cobalt dishing control agent, for example, about 95 ppm or less, about 90 ppm or less, about 85 ppm or less, about 80 ppm or less, about 75 ppm or less, about 70 ppm or less, about 65 ppm or less, about 60 ppm or less, about 55 ppm or less, or about 50 ppm or less. Thus, the polishing composition can comprise the cobalt dishing control agent in an amount bounded by any two of the aforementioned endpoints. For example, the polishing composition can comprise about 1 ppm to about 100 ppm of the cobalt dishing control agent, about 5 ppm to about 100 ppm, about 5 ppm to about 95 ppm, about 5 ppm to about 90 ppm, about 5 ppm to about 85 ppm, about 5 ppm to about 80 ppm, about 5 ppm to about 75 ppm, about 5 ppm to about 70 ppm, about 10 ppm to about 100 ppm, about 10 ppm to about 95 ppm, about 10 ppm to about 90 ppm, about 10 ppm to about 85 ppm, about 10 ppm to about 80 ppm, about 10 ppm to about 75 ppm, about 10 ppm to about 70 ppm, or about 25 ppm to about 75 ppm.

It will be appreciated that, depending on the pH of the polishing composition, the aforementioned sarcosine derivatives or diphenyloxide disulfonate can exist in the form of a salt (e.g., a metal salt, an ammonium salt, or the like), an acid, or as a mixture of an acid and a salt thereof. The acid or salt forms or mixtures thereof of the sarcosine derivatives or diphenyloxide disulfonate are suitable for use in the preparation of the polishing composition.

The polishing composition optionally further comprises a cobalt accelerator. The cobalt accelerator can be any suitable compound that enhances the removal rate for cobalt when the polishing composition is used to polish a substrate comprising cobalt. The cobalt accelerator can be selected from a compound having the formula: NR$^1$R$^2$R$^3$ wherein R$^1$, R$^2$, and R$^3$ are independently selected from hydrogen, carboxyalkyl, substituted carboxyalkyl, hydroxyalkyl, substituted hydroxyalkyl and aminocarbonylalkyl, wherein none or one of R$^1$, R$^2$, and R$^3$ are hydrogen; dicarboxyheterocycles; heterocyclylalkyl-α-amino acids; N-(amidoalkyl) amino acids; unsubstituted heterocycles; alkyl-substituted heterocycles; substituted-alkyl-substituted heterocycles; N-aminoalkyl-α-amino acids; and combinations thereof.

The cobalt accelerator can be any suitable cobalt accelerator selected from the classes of compounds recited herein. In preferred embodiments, the cobalt accelerator is iminodiacetic acid, 2-[bis(2-hydroxyethyl)amino]-2-(hydroxymethyl)-1,3-propanediol, bicine, picolinic acid, dipicolinic acid, histidine, [(2-amino-2-oxoethyl)amino]acetic acid, imidazole, N-methylimidazole, lysine, or combinations thereof.

The cobalt accelerator can be present in the polishing composition in any suitable concentration. Typically, the cobalt accelerator can be present in the polishing composition in a concentration of about 5 mM or more, for example, about 10 mM or more, about 15 mM or more, about 20 mM or more, about 25 mM or more, about 30 mM or more, about 35 mM or more, about 40 mM or more, about 45 mM or more, or about 50 mM or more. Alternatively, or in addition, the cobalt accelerator can be present in the polishing composition in a concentration of about 100 mM or less, for example, about 95 mM or less, about 90 mM or less, about 85 mM or less, about 80 mM or less, about 75 mM or less, about 70 mM or less, about 65 mM or less, or about 60 mM or less. Thus, the cobalt accelerator can be present in the polishing composition in a concentration bounded by any two of the aforementioned endpoints. For example, the cobalt accelerator can be present in the polishing composition in a concentration of about 5 mM to about 100 mM, for example, about 5 mM to about 90 mM, about 5 mM to about 80 mM, about 5 mM to about 70 mM, about 5 mM to about 60 mM, about 10 mM to about 100 mM, about 10 mM to about 90 mM, about 10 mM to about 80 mM, about 10 mM to about 70 mM, about 10 mM to about 60 mM, about 20 mM to about 100 mM, about 20 mM to about 90 mM, about 20 mM to about 80 mM, about 20 mM to about 70 mM, or about 20 mM to about 60 mM.

The polishing composition comprises an oxidizing agent that oxidizes a transition metal. Preferably, the oxidizing agent oxidizes cobalt. The oxidizing agent can be any suitable oxidizing agent having an oxidation potential of sufficient magnitude at the pH of the polishing composition to oxidize cobalt. In a preferred embodiment, the oxidizing agent is hydrogen peroxide.

The polishing composition can comprise any suitable amount of the oxidizing agent. The polishing composition preferably comprises about 10 wt. % or less (e.g., about 8 wt. % or less, about 6 wt. % or less, about 4 wt. % or less, about 2 wt. % or less, about 1 wt. % or less, or about 0.5 wt. % or less) of hydrogen peroxide.

The polishing composition can have any suitable pH. Typically, the polishing composition can have a pH of about 3 or more, e.g., about 3.5 or more, about 4 or more, about 4.5 or more, about 5 or more, about 5.5 or more, about 6 or more, about 6.5 or more, or about 7 or more. Alternatively, or in addition, the polishing composition can have a pH of about 8.5 or less, e.g., about 8.4 or less, about 8.3 or less, about 8.2 or less, about 8.1 or less, or about 8 or less. Thus, the polishing composition can have a pH bounded by any two of the above endpoints recited for the polishing composition. For example the polishing composition can have a pH of about 3 to about 8.5, e.g., about 3.5 to about 8.5, about 4 to about 8.5, about 4.5 to about 8.5, about 5 to about 8.5, about 5.5 to about 8.5, about 6 to about 8.5, about 6.5 to about 8.5, about 6.5 to about 8.4, about 6.5 to about 8.3, about 6.5 to about 8.2, about 6.5 to about 8.1, or about 6.5 to about 8.

The pH of the polishing composition can be adjusted using any suitable acid or base. Non-limiting examples of suitable acids include nitric acid, sulfuric acid, phosphoric acid, and organic acids such as acetic acid. Non-limiting examples of suitable bases include sodium hydroxide, potassium hydroxide, and ammonium hydroxide.

The chemical-mechanical polishing composition optionally further comprises one or more additives. Illustrative additives include conditioners, acids (e.g., sulfonic acids), complexing agents (e.g., anionic polymeric complexing agents), chelating agents, biocides, scale inhibitors, dispersants, etc.

A biocide, when present, can be any suitable biocide and can be present in the polishing composition in any suitable amount. A suitable biocide is an isothiazolinone biocide. The amount of biocide in the polishing composition typically is about 1 to about 50 ppm, preferably about 10 to about 40 ppm, more preferably about 20 to about 30 ppm.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, cobalt corrosion inhibitor, cobalt dishing control agent, oxidizing agent, optional cobalt accelerator, optional pH adjustor, etc.) as well as any combination of ingredients (e.g., abrasive, cobalt corrosion inhibitor, cobalt dishing control agent, oxidizing agent, optional cobalt accelerator, optional pH adjustor, etc.).

For example, the abrasive can be dispersed in water. The cobalt corrosion inhibitor, cobalt dishing control agent, and optional cobalt accelerator can then be added and mixed by any method that is capable of incorporating the components into the polishing composition. The oxidizing agent can be added at any time during the preparation of the polishing composition. The polishing composition can be prepared prior to use, with one or more components, such as the oxidizing agent, added to the polishing composition just before use (e.g., within about 1 minute before use, or within about 1 hour before use, within about 7 days before use, or within about 14 days before use). The polishing composition also can be prepared by mixing the components at the surface of the substrate during the polishing operation.

The polishing composition can be supplied as a one-package system comprising abrasive, cobalt corrosion inhibitor, cobalt dishing control agent, oxidizing agent, optional cobalt accelerator, optional pH adjustor, and water. Alternatively, the abrasive can be supplied as a dispersion in water in a first container, and the cobalt corrosion inhibitor, cobalt dishing control agent, optional cobalt accelerator, and optional pH adjustor can be supplied in a second container, either in dry form, or as a solution or dispersion in water. The oxidizing agent desirably is supplied separately from the other components of the polishing composition and is combined, e.g., by the end-user, with the other components of the polishing composition shortly before use (e.g., 2 weeks or less prior to use, 1 week or less prior to use, 1 day or less prior to use, 1 hour or less prior to use, 10 minutes or less prior to use, or 1 minute or less prior to use). The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the abrasive, cobalt corrosion inhibitor, cobalt dishing control agent, optional cobalt accelerator, and optional pH adjustor, with or without the oxidizing agent, in amounts such that, upon dilution of the concentrate with an appropriate amount of water, and the oxidizing agent if not already present in an appropriate amount, each component of the polishing composition will be present in the polishing composition in an amount within the appropriate range recited above for each component. For example, the abrasive, cobalt corrosion inhibitor, cobalt dishing control agent, optional cobalt accelerator, and optional pH adjustor can each be present in the concentration in an amount that is about 2 times (e.g., about 3 times, about 4 times, or about 5 times) greater than the concentration recited above for each component so that, when the concentrate is diluted with an equal volume of (e.g., 2 equal volumes of water, 3 equal volumes of water, or 4 equal volumes of water, respectively), along with the oxidizing agent in a suitable amount, each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

The invention also provides a method of chemically-mechanically polishing a substrate comprising (i) contacting a substrate with a polishing pad and the chemical-mechanical polishing composition as described herein, (ii) moving the polishing pad relative to the substrate with the chemical-mechanical polishing composition therebetween, and (iii) abrading at least a portion of the substrate to polish the substrate.

The substrate to be polished using the method of the invention can be any suitable substrate, especially a substrate that contains cobalt. A preferred substrate comprises at least one layer, especially an exposed layer for polishing, comprising, consisting essentially of, or consisting of cobalt, such that at least a portion of the cobalt is abraded (i.e., removed) to polish the substrate. Particularly suitable substrates include, but are not limited to, wafers used in the semiconductor industry. The wafers typically comprise or consist of, for example, a metal, metal oxide, metal nitride, metal composite, metal alloy, a low dielectric material, or combinations thereof. In preferred embodiments, the wafers comprise patterns of circuit traces etched into the surface of a substrate that are filled with cobalt. The method of the invention is also useful for polishing substrates comprising cobalt and cobalt alloys useful in turbine blades for gas turbines and jet aircraft engines, orthopedic implants, prosthetic parts such as hip and knee replacements, dental prosthetics, high speed steel drill bits, and permanent magnets.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, polyisocyanurate, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

A chemical-mechanical polishing process can be characterized in a number of ways, such as in terms of the removal rate of a substrate, dishing, and erosion.

The removal rate of a substrate can be determined using any suitable technique. Examples of suitable techniques for determining the removal rate of a substrate include weighing the substrate before and after use of the inventive polishing method to determine the amount of substrate removed per unit of polishing time, which can be correlated with the removal rate in terms of thickness of substrate removed per unit of polishing time, and determining the thickness of the substrate before and after use of the inventive polishing method to directly measure the removal rate of the substrate per unit of polishing time.

Dishing and erosion can be determined using any suitable techniques. Examples of suitable techniques for determining dishing and erosion include scanning electron microscopy, stylus profiling, and atomic force microscopy. Atomic force microscopy can be performed using the Dimension Atomic Force Profiler (AFP™) from Veeco (Plainview, N.Y.).

Without wishing to be bound by any particular theory, it is believed that anionic surfactants assemble on a cationic cobalt substrate, but compete with anionic rate accelerators for binding sites. As cobalt is removed and underlying silicon oxide is exposed, the relative surface concentration of the anionic surfactant on cobalt is increased, since the surface area of exposed cobalt is reduced. The long chain anionic surfactant (i.e., $C_{13}$-$C_{20}$ aliphatic dishing control agent) is believed to anchor to cobalt in the trenches first and enables the shorter chain surfactant (i.e., $C_9$-$C_{14}$ aliphatic cobalt corrosion inhibitor) to assemble and pack together more quickly on the cobalt surface than would otherwise occur in the absence of the long chain anionic surfactant. The increased concentration of cobalt corrosion inhibitor and cobalt dishing control agent on the cobalt surface is thought to inhibit cobalt removal by both chemical means (inhibition of corrosion and inhibition of the cobalt accelerator, if present) and mechanical means (protection from abrasion). As a result, the cobalt removal from cleared features is effectively slowed, resulting in improved dishing performance.

The invention is exemplified by the following embodiments:

1. A chemical-mechanical polishing composition comprising:
   (a) abrasive particles,
   (b) a cobalt corrosion inhibitor,
   (c) a cobalt dishing control agent, wherein the cobalt dishing control agent comprises an anionic head group and a $C_{13}$-$C_{20}$ aliphatic tail group,
   (d) an oxidizing agent that oxidizes cobalt, and
   (e) water,
wherein the polishing composition has a pH of about 3 to about 8.5.

2. The polishing composition of embodiment 1, wherein the polishing composition comprises about 0.1 wt. % to about 2 wt. % of abrasive particles.

3. The polishing composition of embodiment 1 or 2, wherein the cobalt corrosion inhibitor comprises an anionic head group and a $C_8$-$C_{14}$ aliphatic tail group.

4. The polishing composition of any one of embodiments 1-3, wherein the cobalt corrosion inhibitor has the formula: $RCON(CH_3)COOH$ wherein R is a $C_8$-$C_{13}$ aliphatic group.

5. The polishing composition of any one of embodiments 1-4, wherein the polishing composition comprises about 50 ppm to about 1000 ppm of the cobalt corrosion inhibitor.

6. The polishing composition of any one of embodiments 1-5, wherein the cobalt dishing control agent comprises an anionic head group and a $C_{15}$-$C_{18}$ aliphatic tail group 7. The polishing composition of any one of embodiments 1-5, wherein the cobalt dishing control agent has the formula: $RCON(CH_3)COOH$ wherein R is a $C_{15}$-$C_{17}$ aliphatic group, or is a $C_{16}$-$C_{18}$ alkyl diphenyloxide disulfonate.

8. The polishing composition of any one of embodiments 1-7, wherein the polishing composition comprises about 5 ppm to about 100 ppm of the cobalt dishing control agent.

9. The polishing composition of any one of embodiments 1-8, wherein the polishing composition further comprises a cobalt accelerator selected from a compound having the formula: $NR^1R^2R^3$ wherein $R^1$, $R^2$, and $R^3$ are independently selected from hydrogen, carboxyalkyl, substituted carboxyalkyl, hydroxyalkyl, substituted hydroxyalkyl and aminocarbonylalkyl, wherein none or one of $R^1$, $R^2$, and $R^3$ are hydrogen; dicarboxyheterocycles; heterocyclylalkyl-α-amino acids; N-(amidoalkyl)amino acids; unsubstituted heterocycles; alkyl-substituted heterocycles; substituted-alkyl-substituted heterocycles; N-aminoalkyl-α-amino acids; and combinations thereof.

10. The polishing composition of any one of embodiments 1-9, wherein the oxidizing agent is hydrogen peroxide.

11. A method of chemically mechanically polishing a substrate comprising:
   (i) contacting a substrate with a polishing pad and a chemical-mechanical polishing composition of any one of embodiments 1-10,
   (ii) moving the polishing pad and the chemical mechanical polishing composition relative to the substrate, and
   (iii) abrading at least a portion of the substrate to polish the substrate.

12. The method of embodiment 11, wherein the substrate comprises cobalt, and least a portion of the cobalt is abraded to polish the substrate.

13. The method of embodiment 11 or 12, wherein the substrate comprises a semiconductor device.

The following examples further illustrate the invention but, of course, should not be construed as in any way limiting its scope.

EXAMPLE 1

This example demonstrates blanket cobalt removal rates on patterned wafers exhibited by polishing compositions containing a cobalt corrosion inhibitor and a cobalt dishing control agent in accordance with an embodiment of the invention.

Patterned substrates comprising a layer of cobalt over a patterned silicon oxide substrate were polished with five different polishing compositions, Polishing Compositions 1A-1E. The substrates comprised pattern features that were 50 μm wide and 50 μm long. Each of Polishing Compositions 1A-1E contained 0.5 wt. % of wet-process silica having an average particle size of 70 nm (Fuso Chemical Co. Japan), 0.6 wt. % iminodiacetic acid, 0.04 wt. % bis-tris buffer, 0.5 wt. % hydrogen peroxide, and 31 ppm Kordek biocide in water at a pH of 7.5. Each of Polishing Compositions 1A-1E also contained the particular cobalt corrosion inhibitor and/or cobalt dishing control agent in the amounts set forth in Table 1A, where TSF-20 is a $C_{16}$-alkyldiphenyloxide disulfonate cobalt dishing control agent.

TABLE 1A

| Polishing Composition | Cobalt Corrosion Inhibitor | Cobalt Dishing Control Agent |
| --- | --- | --- |
| 1A (comparative) | 800 μM N-lauroylsarcosine | None |
| 1B (comparative) | 1000 μM N-lauroylsarcosine | None |
| 1C (invention) | 800 μM N-lauroylsarcosine | 10 ppm TSF-20 |
| 1D (invention) | 800 μM N-lauroylsarcosine | 20 ppm N-oleyl sarcosine |
| 1E (comparative) | 800 μM N-cocoyl sarcosine | None |

The substrates were polished under three different sets of polishing conditions: (a) 20 seconds at 10.3 kPa downforce, (b) 10 seconds at 10.3 kPa downforce, and (c) 10 seconds at 20.7 kPa downforce. Substrates were also polished at 20.7 kPa downforce until the surface was clear of cobalt plus 5 seconds.

Following polishing, the cobalt removal rates were determined for substrates polished for 10 and 20 seconds. For the substrates polished until clear of surface cobalt, the time to clear plus 5 seconds was measured. The results are set forth in Table 1B.

TABLE 1B

| | Co RR (Å/min) | | | Time to |
| --- | --- | --- | --- | --- |
| Polishing Composition | 20 sec @ 10.3 kPa downforce | 10 sec @ 10.3 kPa downforce | 10 sec @ 20.7 kPa downforce | clear + 5 sec 20.7 kPa downforce |
| 1A (comparative) | 3350 | 2858 | 3194 | 54 sec |
| 1B (comparative) | 3162 | 2812 | 2990 | 50 sec |
| 1C (invention) | 2682 | 2593 | 2938 | 51 sec |
| 1D (invention) | 2751 | 2674 | 2993 | 50 sec |
| 1E (comparative) | 3175 | 2810 | 3187 | 55 sec |

As is apparent from the results set forth in Table 1, the cobalt removal rates at 20.7 kPa downforce were roughly comparable among the inventive and comparative polishing compositions, with the removal rates observed for Polishing Compositions 1C and 1D being approximately 92% and 94%, respectively, as compared with the removal rate observed for Polishing Composition 1A. The time to clear plus 5 seconds was also similar among the polishing compositions.

EXAMPLE 2

This example demonstrates the effect of dishing observed on cobalt-coated patterned wafers exhibited by polishing compositions containing a cobalt corrosion inhibitor and a cobalt dishing control agent in accordance with an embodiment of the invention.

Patterned substrates comprising a layer of cobalt over a patterned silicon oxide substrate were polished with five different polishing compositions, Polishing Compositions 1A-1E as described in Example 1. The substrates comprised pattern features that were 50 µm wide and 50 µm long. Each of Polishing Compositions 1A-1E was used to polish one patterned substrate at a downforce of 20.7 kPa to endpoint plus 5 seconds and a second patterned substrate at a downforce of 20.7 kPa for a time of endpoint minus 20%.

Following polishing, dishing was determined for each substrate at a mid-center position of the substrate. The results are set forth in Table 2.

TABLE 2

| Polishing Composition | Dishing (Å) | |
|---|---|---|
| | EP + 5 s | EP − 20% |
| 1A (comparative) | 640 | 613 |
| 1B (comparative) | 369 | 337 |
| 1C (invention) | 268 | 237 |
| 1D (invention) | 208 | 217 |
| 1E (comparative) | 630 | 620 |

As is apparent from the results set forth in Table 2, the use of Polishing Compositions 1A and 1E, which contained 800 ppm of N-lauroylsarcosine and N-cocoylsarcosine, respectively, which have $C_{12}$ and $C_{14}$ alkyl tail groups, resulted in total loss of cobalt in the 50 µm×50 µm trench lines of the patterned substrate. The use of Polishing Composition 1B, which contained 1000 ppm of N-lauroylsarcosine, resulted in reduced dishing compared with Polishing Composition 1A, which contained 800 ppm of N-lauroylsarcosine. However, energy-dispersive X-ray spectroscopy showed that cobalt was not completely cleared from the silicon oxide features on the substrate surface. The use of Polishing Composition 1C, which contained a combination of 800 µM of N-lauroylsarcosine and 10 ppm of TSF-20 (i.e., a $C_{16}$-alkyldiphenyloxide disulfonate cobalt dishing control agent) resulted in dishing that was approximately 72% of the dishing resulting from the use of Polishing Composition 1B at endpoint+5 sec and approximately 70% at endpoint−20%. The use of Polishing Composition 1 D, which contained a combination of 800 µM of N-lauroylsarcosine and 10 ppm of N-oleoylsarcosine (i.e., $C_{18}$-alkylsarcorsine) cobalt dishing control agent) resulted in dishing that was approximately 56% of the dishing resulting from the use of Polishing Composition 1B at endpoint+5 sec and approximately 79% at endpoint −20%. Dishing resulting from the use of Polishing Composition 1D decreased with increased polishing time.

EXAMPLE 3

This example demonstrates the effect of dishing observed on cobalt-coated patterned wafers exhibited by polishing compositions containing a cobalt corrosion inhibitor and a cobalt dishing control agent in accordance with an embodiment of the invention.

Patterned substrates comprising a layer of cobalt over a patterned silicon oxide substrate were polished with five different polishing compositions, Polishing Compositions 3A-3F. All of the polishing compositions contained 0.5 wt. % of wet-process silica having an average particle size of 70 nm (Fuso Chemical Co. Japan), 0.6 wt. % of iminodiacetic acid, 0.5 wt. % hydrogen peroxide, and 31 ppm Kordek MLX biocide in water at a pH of 7.5. Polishing Compositions 3A-3F further contained additives in amounts as set forth in Table 3.

The substrates comprised pattern features that were 50 µm wide and 50 vim long. Each of Polishing Compositions 3A-3F was used to polish one patterned substrate at a downforce of 10.3 kPa to endpoint plus 5 seconds.

Following polishing, dishing was determined for each substrate at a mid-center position of the substrate. The results are set forth in Table 3.

TABLE 3

| Polishing Composition | Additive(s) | Polishing time (s) | 50 × 50 µm Dishing (Å) |
|---|---|---|---|
| 3A (comparative) | 1000 µM N-lauroylsarcosine | 51 | 428 |
| 3B (comparative) | 800 µM N-lauroylsarcosine | 54 | 627 |
| 3C (invention) | 800 µM N-lauroylsarcosine + 20 ppm N-oleoylsarcosine | 50 | 346 |
| 3D (comparative) | 800 µM N-cocoylsarcosine | 55 | 634 |
| 3E (comparative) | 20 ppm N-oleoylsarcosine | 52 | 639 |
| 3F (comparative) | 20 ppm TSF-20 | 54 | 632 |

As is apparent from the results set forth in Table 3, the use of Polishing Composition 3C, which contained 800 µM N-lauroylsarcosine and 20 ppm N-oleoylsarcosine, resulted in dishing that was approximately 81% of the dishing resulting from the use of Polishing Composition 3A, which contained 1000 µM N-lauroylsarcosine. The use of Polishing Composition 3C resulted in dishing that was approximately 55% of the dishing resulting from the use of Polishing Composition 3B, which contained 800 µM N-lauroylsarcosine. The use of polishing compositions 3E and 3F, which contained 20 ppm N-oleoylsarcosine and 20 ppm TSF-20, respectively, but no N-lauroylsarcosine, resulted in dishing that was approximately the same as the dishing resulting from the use of Polishing Composition 3B.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising,"

"having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) abrasive particles,
   (b) a cobalt corrosion inhibitor, wherein the cobalt corrosion inhibitor has the formula: RCON(CH3)CH2COOH wherein R is a $C_8$-$C_{13}$ aliphatic group,
   (c) a cobalt dishing control agent, wherein the cobalt dishing control agent has the formula: RCON(CH3)CH2COOH wherein R is a $C_{15}$-$C_{17}$ aliphatic group, or is a $C_{16}$-$C_{18}$ alkyl diphenyloxide disulfonate,
   (d) an oxidizing agent that oxidizes cobalt, and
   (e) water,
wherein the polishing composition has a pH of about 3 to about 8.5.

2. The polishing composition of claim 1, wherein the polishing composition comprises about 0.1 wt. % to about 2 wt. % of abrasive particles.

3. The polishing composition of claim 1, wherein the polishing composition comprises about 50 ppm to about 1000 ppm of the cobalt corrosion inhibitor.

4. The polishing composition of claim 1, wherein the cobalt dishing control agent comprises an anionic head group and a $C_{15}$-$C_{18}$ aliphatic tail group.

5. The polishing composition of claim 1, wherein the polishing composition comprises about 5 ppm to about 100 ppm of the cobalt dishing control agent.

6. The polishing composition of claim 1, wherein the polishing composition further comprises a cobalt accelerator, wherein the accelerator is iminodiacetic acid.

7. The polishing composition of claim 1, wherein the oxidizing agent is hydrogen peroxide.

* * * * *

UNITED STATES PATENT AND TRADEMARK OFFICE
CERTIFICATE OF CORRECTION

PATENT NO. : 9,834,704 B2
APPLICATION NO. : 14/919490
DATED : December 5, 2017
INVENTOR(S) : Kraft et al.

It is certified that error appears in the above-identified patent and that said Letters Patent is hereby corrected as shown below:

In the Claims

In Column 16, Claim 1(b), Lines 6 and 7, delete "RCON(CH3)CH2COOH" and insert --R-CON(CH$_3$)CH$_2$COOH--.

In Column 16, Claim 1(c), Lines 9 and 10, delete "RCON(CH3)CH2COOH" and insert --R-CON(CH$_3$)CH$_2$COOH--.

Signed and Sealed this
Twenty-first Day of August, 2018

Andrei Iancu
*Director of the United States Patent and Trademark Office*